United States Patent
Itai et al.

(10) Patent No.: US 12,029,136 B2
(45) Date of Patent: Jul. 2, 2024

(54) MAGNETIC MEMORY DEVICE INCLUDING MAGNETORESISTANCE EFFECT ELEMENT

(71) Applicant: Kioxia Corporation, Tokyo (JP)

(72) Inventors: Shogo Itai, Kawasaki Kanagawa (JP);
Tadaomi Daibou, Yokkaichi Mie (JP);
Yuichi Ito, Yokkaichi Mie (JP);
Katsuyoshi Komatsu, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 307 days.

(21) Appl. No.: 17/202,151

(22) Filed: Mar. 15, 2021

(65) Prior Publication Data

US 2022/0085277 A1    Mar. 17, 2022

(30) Foreign Application Priority Data

Sep. 16, 2020    (JP) ................. 2020-155599

(51) Int. Cl.
*H10N 50/80*    (2023.01)
*H01F 10/32*    (2006.01)
(Continued)

(52) U.S. Cl.
CPC ......... *H10N 50/80* (2023.02); *H01F 10/3286* (2013.01); *H01F 10/329* (2013.01);
(Continued)

(58) Field of Classification Search
CPC ........ H10N 59/00; H10N 50/80; H10N 50/10; H10B 61/00; H10B 61/10; H01F 10/3286;
(Continued)

(56) References Cited

U.S. PATENT DOCUMENTS 7,035,137 B2    4/2006    Iwata et al.
9,825,217 B1    11/2017    Kim et al.
(Continued)

FOREIGN PATENT DOCUMENTS

CN    101399313 A    4/2009
CN    109427963 A    3/2019
(Continued)

OTHER PUBLICATIONS

U.S. Appl. No. 16/816,775; First Named Inventor: Masaru Toko; Title: "Magnetoresistive Memory Device"; Filed: Mar. 12, 2020.

*Primary Examiner* — Patricia D Valenzuela
(74) *Attorney, Agent, or Firm* — Holtz, Holtz & Volek PC

(57) ABSTRACT

According to one embodiment, a magnetic memory device includes a magnetoresistance effect element including first and second magnetic layers each having a fixed magnetization direction, a third magnetic layer provided between the first and second magnetic layers, and having a variable magnetization direction, a first nonmagnetic layer between the first and third magnetic layers, and a second nonmagnetic layer between the second and third magnetic layers, and a switching element connected in series to the magnetoresistance effect element, changing from an electrically nonconductive state to an electrically conductive state when a voltage applied between two terminals is higher than or equal to a threshold voltage.

20 Claims, 4 Drawing Sheets

(51) Int. Cl.
*H10B 61/00* (2023.01)
*H10N 50/10* (2023.01)

(52) U.S. Cl.
CPC ......... *H10B 61/10* (2023.02); *H01F 10/3254* (2013.01); *H01F 10/3272* (2013.01); *H10N 50/10* (2023.02)

(58) Field of Classification Search
CPC ............... H01F 10/329; H01F 10/3254; H01F 10/3263; H01F 10/3272
USPC ........................................................ 257/421
See application file for complete search history.

(56) References Cited

U.S. PATENT DOCUMENTS

| | | | |
|---|---|---|---|
| 9,876,164 | B1 | 1/2018 | Tang et al. |
| 10,128,311 | B2 | 11/2018 | Ito |
| 10,304,509 | B2 | 5/2019 | Yoshikawa et al. |
| 10,355,203 | B2 | 7/2019 | Ito |
| 10,381,549 | B2 | 8/2019 | Ito |
| 10,522,752 | B1 | 12/2019 | Jan et al. |
| 2007/0149449 | A1 | 6/2007 | Morris et al. |
| 2009/0080239 | A1 | 3/2009 | Nagase et al. |
| 2014/0008742 | A1 | 1/2014 | Chen et al. |
| 2014/0269032 | A1 | 9/2014 | Ong et al. |
| 2015/0263068 | A1 | 9/2015 | Ito |
| 2017/0357600 | A1 | 12/2017 | Moon |
| 2018/0268887 | A1* | 9/2018 | Endo .................. G11C 13/0061 |
| 2019/0067366 | A1 | 2/2019 | Lee et al. |
| 2019/0088855 | A1* | 3/2019 | Yamakawa ............ H10N 50/80 |
| 2019/0295615 | A1 | 9/2019 | Fukuzawa et al. |
| 2020/0052038 | A1 | 2/2020 | Kim et al. |
| 2020/0083432 | A1 | 3/2020 | Iwasaki et al. |
| 2020/0083443 | A1 | 3/2020 | Ito et al. |
| 2020/0220071 | A1 | 7/2020 | Guo |
| 2020/0294567 | A1* | 9/2020 | Oikawa et al. ......... G11C 11/16 |
| 2020/0313084 | A1* | 10/2020 | Ouellette ............... H10B 61/22 |

FOREIGN PATENT DOCUMENTS

| | | |
|---|---|---|
| JP | 2004288311 A | 10/2004 |
| JP | 2007524362 A | 8/2007 |
| JP | 2009207497 A | 9/2009 |
| JP | 2012064624 A | 3/2012 |
| JP | 2013254957 A | 12/2013 |
| JP | 2014179618 A | 9/2014 |
| JP | 2015213125 A | 11/2015 |
| JP | 2017220242 A | 12/2017 |
| JP | 6313076 B2 | 3/2018 |
| JP | 6319954 B2 | 4/2018 |
| TW | 202023083 A | 6/2020 |
| WO | 2004074321 A2 | 9/2004 |

\* cited by examiner (a)                                  (b)

MAGNETIC MEMORY DEVICE INCLUDING MAGNETORESISTANCE EFFECT ELEMENT

CROSS-REFERENCE TO RELATED APPLICATIONS

This application is teased upon and claims the benefit of priority from Japanese Patent Application No. 2020-155539, filed Sep. 16, 2020, the entire contents of which are incorporated herein by reference.

FIELD

Embodiments described herein relate generally to a magnetic memory device.

BACKGROUND

A nonvolatile magnetic memory device in which memory cells each containing a magnetoresistance effect element and a switching element (a selector) are integrated on a semiconductor substrate, has been proposed.

DETAILED DESCRIPTION

In general, according to one embodiment, a magnetic memory device includes: a magnetoresistance effect element including: a first magnetic layer having a fixed magnetization direction; a second magnetic layer having a fixed magnetization direction; a third magnetic layer provided between the first magnetic layer and the second magnetic layer, and having a variable magnetization direction; a first nonmagnetic layer provided between the first magnetic layer and the third magnetic layer; and a second nonmagnetic layer-provided between the second magnetic layer and the third magnetic layer; and a two-terminal switching element, connected in series to the magnetoresistance effect element, changing from an electrically nonconductive state to an electrically conductive state when a voltage applied between two terminals thereof is higher than or equal to a threshold voltage.

Embodiments will be described hereinafter with reference to the accompanying drawings.

Figure 1A:
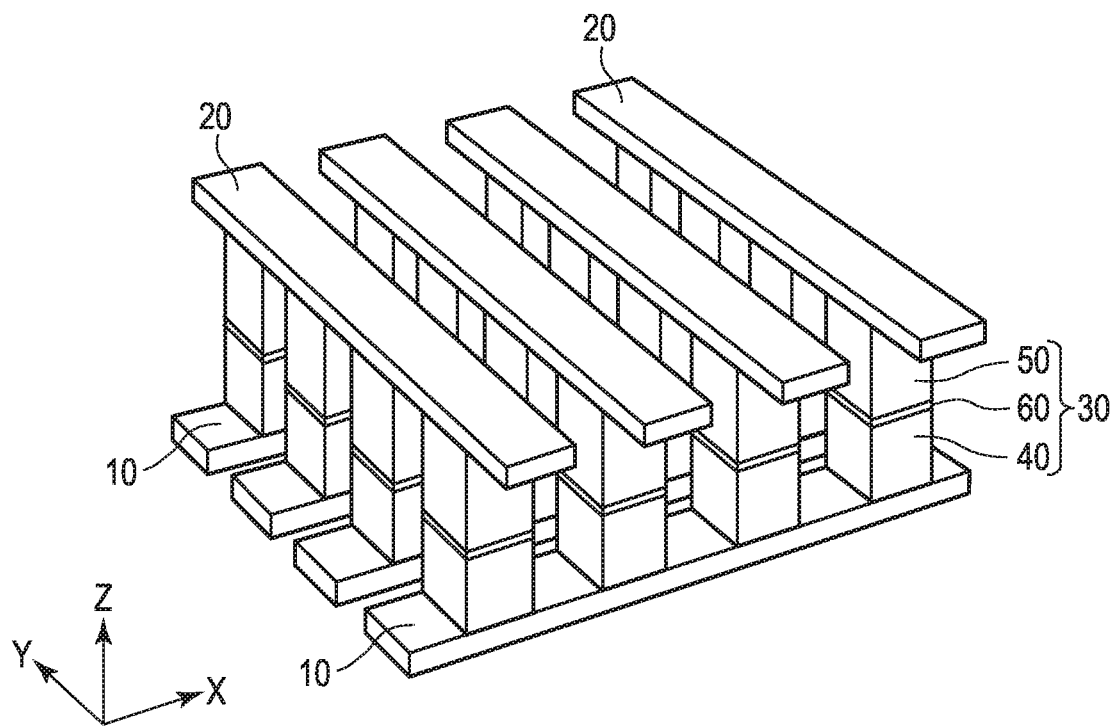
FIG. 1A is a perspective diagram schematically showing an example of a configuration of a magnetic memory device according to an embodiment.
Figure 1B:
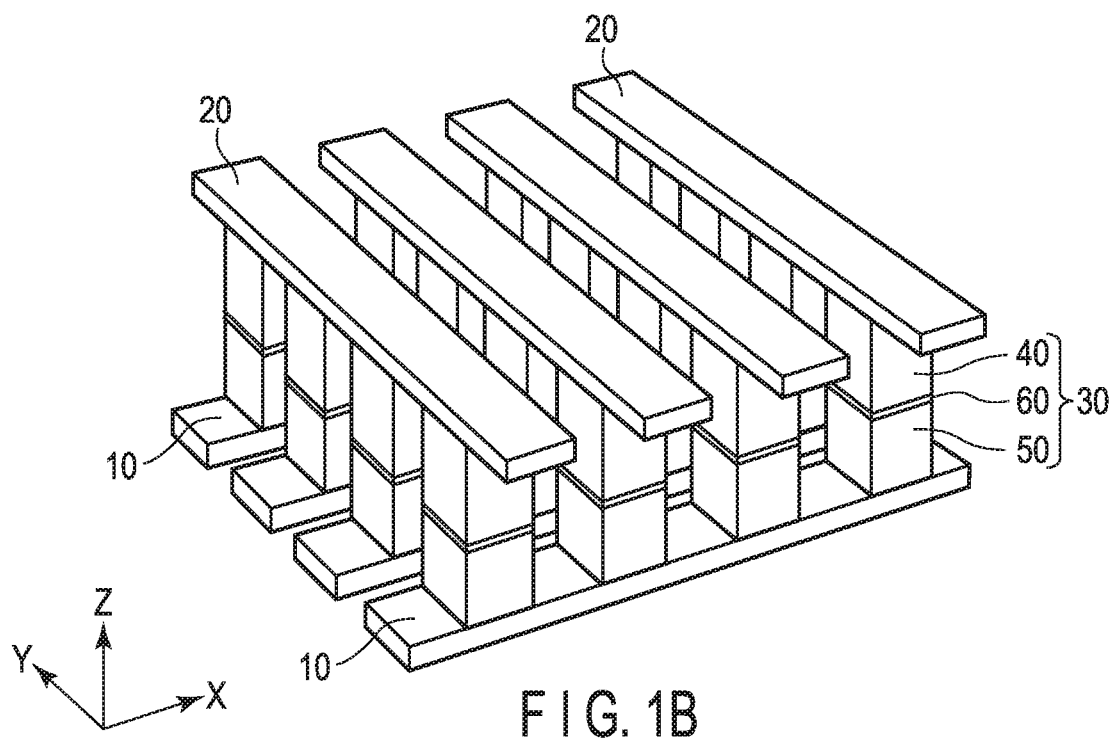
FIG. 1B is a perspective diagram schematically showing another example of the configuration of the magnetic memory device according to the embodiment.

FIG. 1A is a perspective diagram schematically showing a configuration of a nonvolatile magnetic memory device according to an embodiment. The structure shown in FIG. 1A is integrated on a semiconductor substrate (not shown).

As shown in FIG. 1A, the magnetic memory device according to this embodiment comprises a plurality of first wiring lines 10 extending along an X-direction, a plurality of second wiring lines 20 extending along a Y-direction crossing the X-direction, and a plurality of memory cells 30 each connected between, respective one of the first wiring lines 10 and respective one of the second wiring lines 20. One group of the first wiring lines 10 and the second wiring lines 20 correspond to word lines and the other group corresponds to bit lines.

Each memory cell 30 includes a magnetoresistance effect element 40 and a selector (switching element) 50 serially connected to the magnetoresistance effect element 40. In the example shown in FIG. 3.A, a conductive buffer layer 60 is provided between the magnetoresistance effect element 40 and the selector 50. Note that this embodiment, will be described in connection with the case where the magnetoresistance effect element 40 is a magnetic tunnel junction (MTJ) device.

When a predetermined voltage is applied between a first wiring line 10 and a second wiring line 20 connected to a desired memory cell 30, the selector 50 contained in the desired memory cell 30 is set in an ON state, and thus read or write is carried cut on the magnetoresistance effect element 40 contained in the desired memory cell 30.

Note that the magnetic memory device illustrated in FIG. 3A has a structure in which the selector 50 is provided on an upper, side of the magnetoresistance effect element 40, but as illustrated in FIG. IB, the magnetoresistance effect element 40 may be provided on an upper side of the selector 50.

Figure 2:
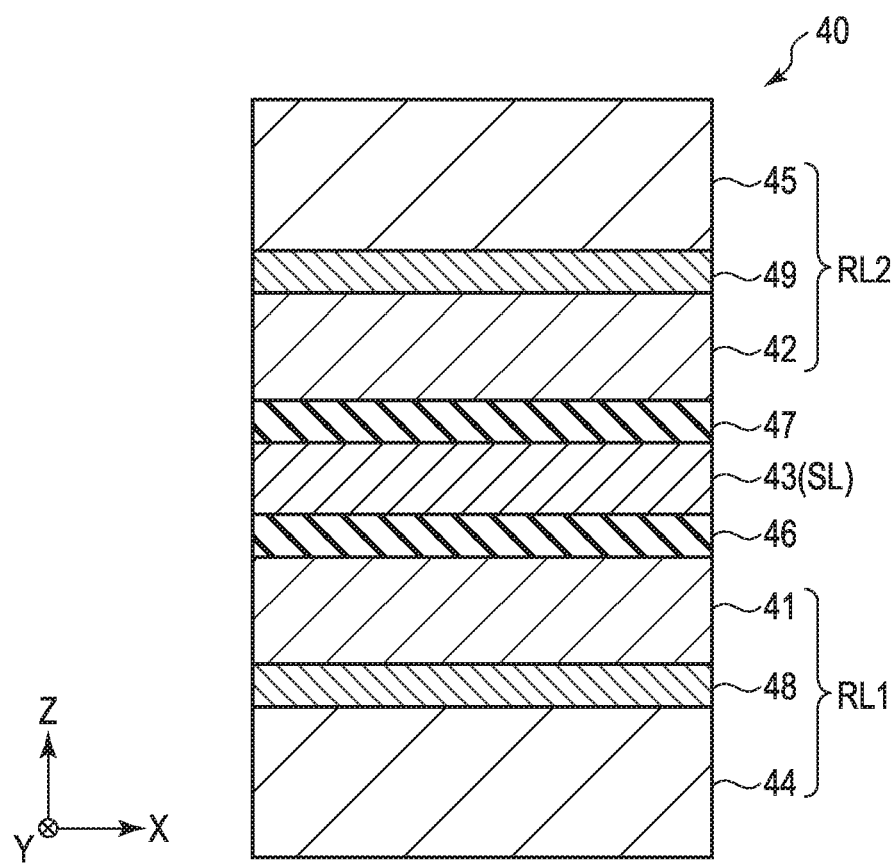
FIG. 2 is a cross-sectional view schematically illustrating a configuration of a magnetoresistance effect element contained in the magnetic memory device according to the embodiment.

FIG. 2 is a cross-sectional view schematically showing the configuration of the magnetoresistance effect element 40.

As shown in FIG. 2, the magnetoresistance effect element 40 includes a first magnetic layer 41, a second magnetic layer 42, a third magnetic layer 43, a fourth magnetic layer 44, a fifth magnetic layer 45, a first tunnel barrier layer (a first nonmagnetic layer) 46, a second tunnel barrier layer (a second nonmagnetic layer) 47, a first intermediate layer 48 and a second intermediate layer 49, and has a structure in which the layers 41 to 49 are stacked along a Z-direction.

More specifically, the third magnetic layer 43 is provided between the first magnetic layer 41 and the second magnetic layer 42, the first tunnel barrier layer (the first nonmagnetic layer) 46 is provided between the first magnetic layer 41 and the third magnetic layer 43, and the second tunnel barrier layer (the second nonmagnetic layer) 47 is provided between the second magnetic layer 42 and the third magnetic layer 43. Further, the first magnetic layer 41, the second magnetic layer 42 and the third magnetic layer 43 are provided between the fourth magnetic layer 44 and the fifth magnetic layer 45.

The first magnetic layer 41 is a ferromagnetic layer having a fixed magnetization direction, and functions as a part of a first reference layer RL1. The fixed magnetization direction indicates that the magnetization direction does not change with regard to a predetermined write current. The first magnetic layer 41 is formed from, for example, a Co Feb layer containing cobalt (Co), iron (Fe) and boron (B).

The second magnetic layer 42 as well is a ferromagnetic layer having a fixed magnetization direction, and also functions as a part of a second reference layer RL2. The magnetization direction of the first magnetic layer 41 and the magnetization direction of the second magnetic layer 42 are parallel to each other. That is, the magnetization direction of the first magnetic layer 41 and the magnetization direction of the second magnetic layer 42 are the same as each other. The second magnetic layer 42 as well is formed from, for example, a CoFeS layer containing cobalt (Co), iron (re) and boron (B).

The third magnetic layer 43 is a ferromagnetic layer having a variable magnetization direction, and functions as a storage layer SL. The variable magnetization direction indicates that the magnetization direction changes with respect to a predetermined write current. The third magnetic layer 43 is formed from, for example, a CoFeB layer containing cobalt (Co), iron (Fe) and boron (B).

The fourth magnetic layer 44 is a ferromagnetic layer having a fixed magnetization direction, and functions as a part of the first reference layer RL1. The magnetization direction of the fourth magnetic layer 44 is antiparallel to the magnetization direction of the first magnetic layer 41. That is, the magnetization direction of the fourth magnetic layer 44 is reverse to the magnetization direction of the first magnetic layer 41. The fourth magnetic layer 44 is formed from, for example, a superlattice layer in which cobalt (Co) layers and platinum (Pt) layers are stacked on one another alternately.

The fifth magnetic layer 45 as well is a ferromagnetic layer having a fixed magnetization direction, and also functions as a part of the second reference layer PL2. The magnetization direction of the fifth magnetic layer 45 is antiparallel to the magnetization direction of the second magnetic layer 42. That is, the magnetization direction of the fifth magnetic layer 45 is reverse to the magnetization direction of the second magnetic layer 42. The fifth magnetic layer 45 as well is formed from, for example, a superlattice layer in which cobalt (Co) layers and platinum (Pt) layers are stacked on one another alternately.

The first tunnel barrier layer (the first nonmagnetic layer) 46 is an insulating layer provided between the first, magnetic: layer 41 and the third magnetic layer 43. The first tunnel barrier layer 46 is formed from, for example, an KgO layer containing magnesium (Mg) and oxygen (O).

The second tunnel barrier layer (the second nonmagnetic layer) 47 is an insulating layer provided between the second magnetic layer 42 and the third magnetic layer 43. The second tunnel barrier layer 47 as well is formed from, for example, an MgO layer containing magnesium (Mg) and oxygen (O).

The first intermediate layer 48 is provided between the first magnetic layer 41 and the fourth magnetic layer 44 and is formed of a predetermined metal material.

The second intermediate layer 49 is provided between the second magnetic layer 42 and the fifth magnetic layer 45 and is formed of a predetermined metal material.

The magnetoresistance effect element 40 described above is a spin transfer torque (STT) magnetoresistance effect element, having a perpendicular magnetization. Specifically, the magnetization directions of the first magnetic layer 41, the second magnetic layer 42, the third magnetic layer 43, the fourth magnetic layer 44 and the fifth magnetic layer 45 are all perpendicular to the respective film surfaces.

When the magnetization direction of the third magnetic layer 43 is parallel to the magnetization directions of the first magnetic layer 41 and the second magnetic layer 42, the magnetoresistance effect element 40 described above exhibits a relatively low resistance state (a first resistance state), and when the magnetization direction of the third magnetic layer 43 is antiparallel to the magnetization directions of the first magnetic layer 41 and the second magnetic layer 42, it exhibits a relatively high resistance state (a second resistance state;.

Figure 3:
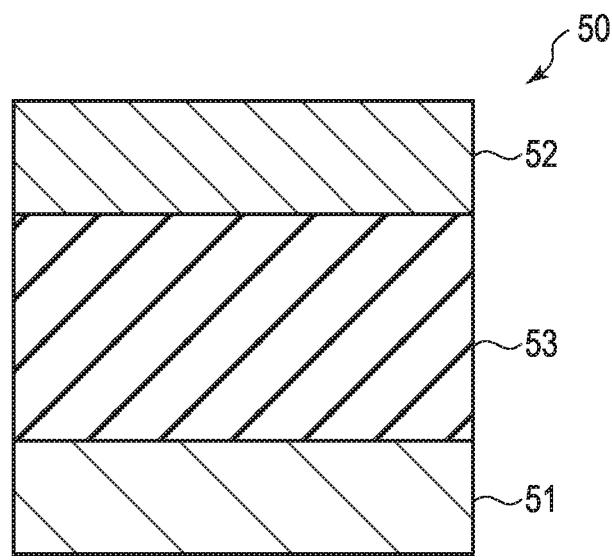
FIG. 3 is a cross-sectional view schematically showing a configuration of a selector contained in the magnetic memory device according to the embodiment.

Therefore, the magnetoresistance effect element can store binary data according t.o the resistance states (the low resistance state and high resistance state). Further, the resistance state of the magnetoresistance effect element 40 can be set according to the direction of current flowing through the magnetoresistance effect element 40. The magnetoresistance effect element; 40 includes substantially two magnetoresistance effect element portions. More specifically, the first magnetoresistance effect element portion is constituted by the first magnetic layer 41, the third magnetic layer 43, the fourth magnetic layer 44, the first tunnel barrier layer 46 and the first intermediate layer 48, and the second magnetoresistance effect element portion is constituted by the second magnetic layer 42, the third magnetic layer 43, the fifth magnetic layer 45, the second tunnel barrier layer 47 and the second intermediate layer 49. In this case, the magnetoresistance ratio (MR ratio) of the first, magnetoresistance effect element, portion and the MR ratio of the second magnetoresistance effect element portion are different from each other. FIG. 3 is a cross-sectional view schematically showing the configuration of the selector (switching element) 50 described above.

As shown in FIG. 3, the selector 50 includes a first electrode 51, a second electrode 52 and a selector material layer 53 provided between the first electrode 51 and the second electrode 52. The selector 50 is a 2-terminal switching element, and when voltage threshold voltage, the switching element is in the "high resistance state", that is, an electrically nonconductive state, and when the voltage applied between the two terminals becomes a threshold voltage or higher, the switching element changes to the "low resistance state", that is, an electrically conductive state.

Figure 4:
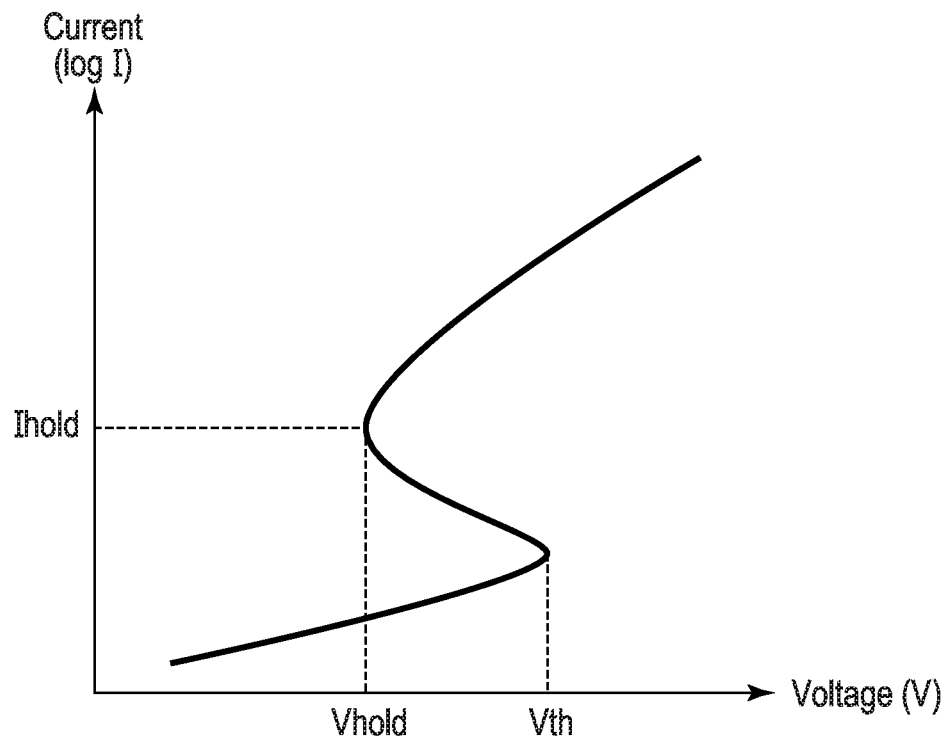
FIG. 4 is a diagram schematically showing current-voltage characteristics of the selector contained in the magnetic memory device according to the embodiment.

FIG. 4 is a diagram schematically showing current-voltage characteristic of the selector 50 used in this embodiment.

The selector 50 has non-linear current-voltage characteristics in which when the voltage applied between the two terminals increases to reach a threshold voltage Vth, it shifts to the ON state (the conductive state) from the OFF state (the nonconductive state), and when it becomes the ON state, the voltage between the two terminals shifts to a hold voltage Vhold, which is lower than the threshold voltage Vth, (here, a current Ihold flows to the selector 50) and the current suddenly increases. Further, the selector 50 has characteristics in which when the voltage applied between the two terminals decreases to reach the hold voltage Vhold, it shifts to the OFF state from the ON state. Further, the selector 50 may have current-voltage characteristics symmetrical to each other in both directions (a positive direction and a negative direction).

Figure 5:
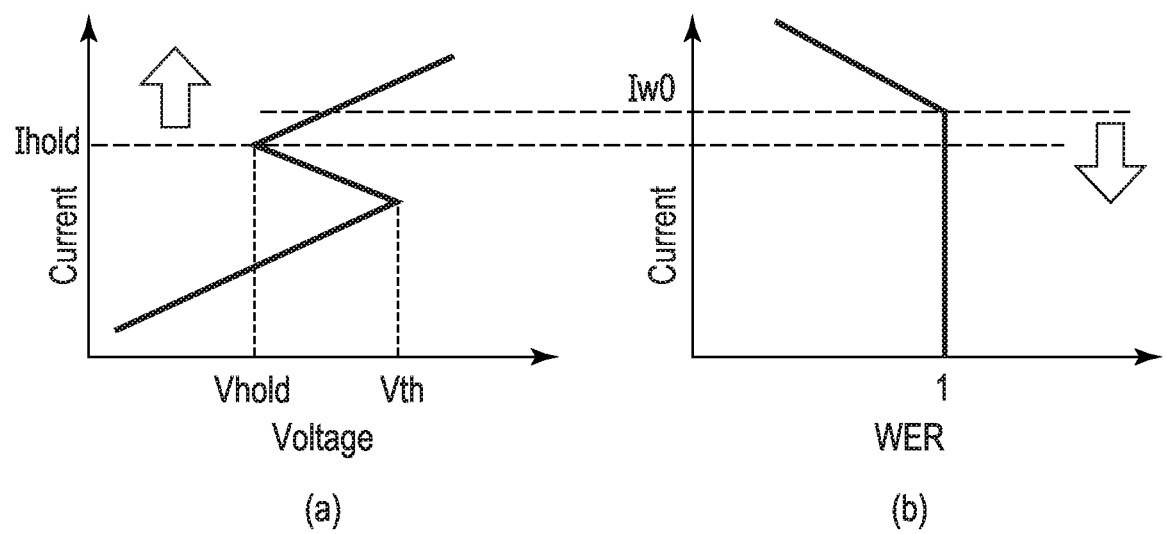
FIG. 5 is a diagram showing a range of current required in a read operation of the magnetic memory device.

In the embodiment, with the magnetic memory device described above, stable read and write operations can be carried out. The details thereof will be described. FIG. 5 is a diagram illustrating a range of the current required in the read operation (a current flowing to the memory cell 30 to which the magnetoresistance effect element 40 and the selector 50 are connected in series).

FIG. 5, part (a) is a diagram schematically showing current-voltage characteristics of the selector 50 and is a simplified version of the current-voltage characteristics shown in FIG. 4. FIG. 5, part (b) is a diagram schematically showing a relationship between a write error rate (WER) of the magnetoresistance effect element 40 and the current flowing to the magnetoresistance effect element 40 (that is, the current flowing to the selector 50).

As already described, when the voltage applied between the two terminals increases to reach the threshold voltage Vth, the selector 50 shifts to the ON state from the OFF state, and when it becomes the ON state, the voltage between the two terminals shifts to the hold voltage Vhold, which is lower than the threshold voltage Vth and the current suddenly increases. Since the range in which the voltage between the two terminals shifts from the threshold voltage Vth to the hold voltage Vhold is an unstable range, it is necessary in order for a stable read operation to allow a current higher than the current Ihold at the time when shifted to the hold voltage Vhold, flow to the selector 50.

On the other hand, when carrying out a write to the magnetoresistance effect element 40, it is necessary to apply a write current higher than the read current to the magnetoresistance effect element 40. More specifically, as shown in FIG. 5, part (b), it is necessary to apply a current higher than a lower limit Iw0 of the write current to the magnetoresistance effect element 40, and as the current Increases from the lower limit Iw0 of the write current, the write error rate (WER) decreases. When it is viewed from a point of read current, it is necessary to apply a read current lower than a lower limit Iw0 of the write current to the magnetoresistance effect element 40 for carrying out a read. When a current higher than the Iw0 flows to the magnetoresistance effect element 40 when carrying out a read, a write might be erroneously carried cut, and a read disturb may occur to the magnetoresistance effect element 40.

Therefore, in order for carrying out a precise read operation, it is necessary to set a read current higher than the hold current Ihold but lower than the lower limit Iw0 of the write current. Further, it is important to secure a sufficient margin to perform a stable read operation, but it is not easy to obtain a great difference between Ihold and Iw0.

In this embodiment, with use of the magnetoresistance effect element 40 described above, a margin in the read operation can be increased, thus making it possible to carry out a stable read operation in which the read disturb is inhibited.

Figure 6:
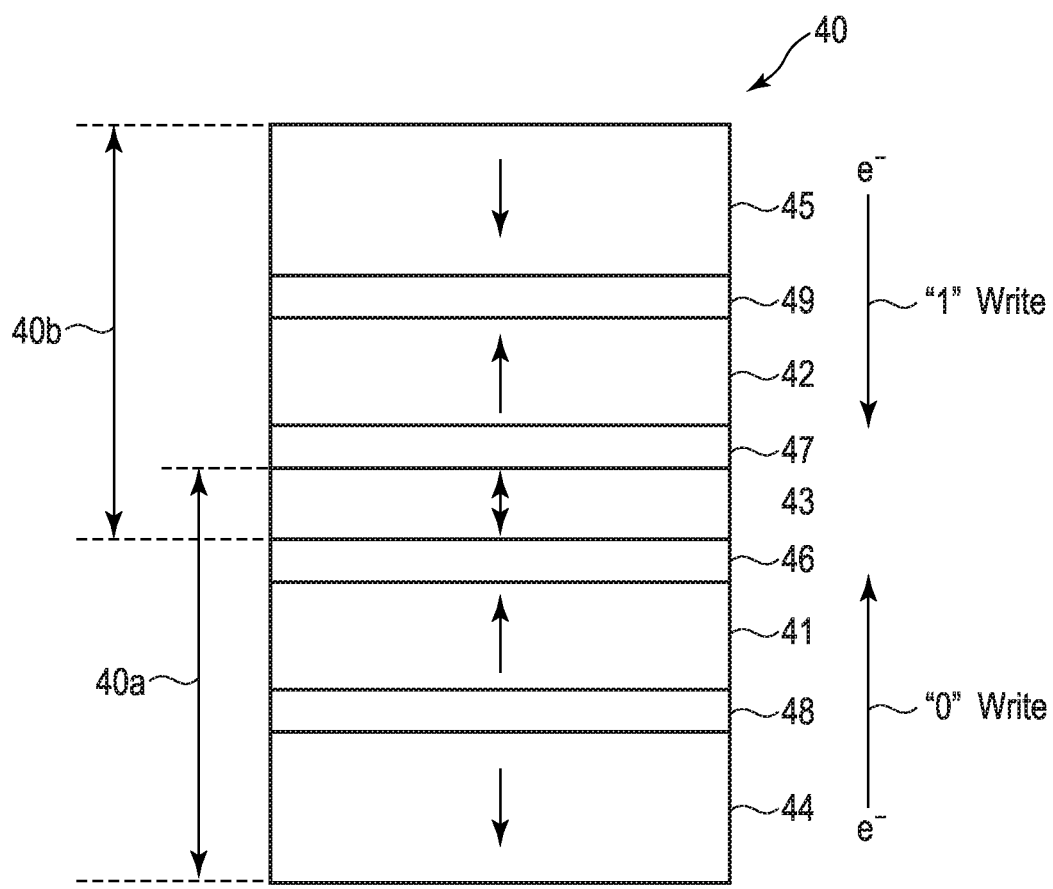
FIG. 6 is a diagram illustrating an operation when carrying out write to the magnetoresistance effect element contained in the magnetic memory device according to the embodiment.

FIG. 6 is a diagram illustrating an operation when a write is carried out to the magnetoresistance effect element 40. Note that arrows indicated in the first magnetic layer 41 to the fifth magnetic layer 45 respectively represent directions of spins of electrons.

First, the case where "0" is written to the magnetoresistance effect element 40 will, be described. In other words, the case where the low resistance state (the state that the magnetization direction of the third magnetic layer 43 is parallel to the magnetization directions of the first magnetic layer 41 and the second magnetic layer 42) is set to the magnetoresistance effect element 40 will be described. When "0" is written to the magnetoresistance effect element 40, current is allowed to flow from an upper layer side to a lower layer side in FIG. 6. Therefore, electron "e⁻" flows to the upper layer side from the lower layer side in FIG. 6.

As already described, the magnetoresistance effect element 40 of this embodiment substantially includes two magnetresistance effect, element, portions 40a and 40b. That is, the first magnetic layer 41, the third magnetic layer 43, the fourth magnetic layer 44, the first tunnel barrier layer 46 and the first intermediate layer 48 constitute the first magnetoresistance effect element portion 40a, and the second magnetic layer 42, the third magnetic layer 43, the fifth magnetic layer 45, the second tunnel barrier layer 47 and the second intermediate layer 49 constitute the second magnetoresistance effect element portion 40b.

First, focusing only on the first magnetoresistance effect element portion 40a, electrons e⁻ flow towards the third magnetic layer 43 from the first magnetic layer 41. From the first magnetic layer 41, electrons e⁻ having an upward spin are easily injected to the third magnetic layer 43, and therefore electrons e⁻ having an upward spin are dominant in the third magnetic layer 43. Therefore, the magnetization direction of the third magnetic layer 43 is made parallel to the magnetization direction, of the first magnetic layer 41.

On the other hand, when focusing only on the second magnetoresistance effect element portion 40b, electrons e⁻ flow towards the second magnetic layer 42 from the third magnetic layer 43. From the third magnetic layer 43, electrons e⁻ having an upward spin are easily injected to the second magnetic layer 42, and therefore electrons e⁻ having a downward spin remain in the third magnetic layer 43. Therefore, the magnetization direction of the third magnetic layer 43 is made anti-parallel to the magnetization direction of the second magnetic layer 42.

As described above, when writing "0" to the magnetoresistance effect element 40, the magnetization direction of the third magnetic layer 43 easily becomes parallel to the magnetization direction of the first magnetic layer 41 in the first magnetoresistance effect element portion 40a, whereas the magnetization direction of the third magnetic layer 43 easily becomes anti-parallel to the magnetization direction of the second magnetic layer 42 in the second magnetoresistance effect element portion 40b. However, in reality, the third magnetic layer 43 is common in the first magnetoresistance effect element portion 40a and the second magnetoresistance effect element portion 40b. For this reason, the magnetization direction of the third magnetic layer 43 is determined depending on the relationship between a write efficiency (an electron injection efficiency through the first tunnel barrier layer 46) of the first magnetoresistance effect element portion 40a and a write efficiency (an electron injection efficiency through the second tunnel barrier layer 47) of the second magnetoresistance effect element portion 40b. Here, when the write efficiency of the first magnetoresistance effect element portion 40a is higher than the write efficiency of the second magnetoresistance effect element portion 40b, the magnetization direction of the third magnetic layer 43 is set upward based on the magnetization direction in the first magnetoresistance effect element portion 40a. As a result, the magnetization direction of the third magnetic layer 43 becomes parallel to the magnetization directions of the first magnetic layer 41 and the second magnetic layer 42, and thus "0" is written to the magnetoresistance effect element 40.

Next, the case where "1" is written to the magnetoresistance effect element 40 will be described. That is, the case where the high resistance state (the state that the magnetization direction of the third magnetic layer 43 becomes antiparallel to the magnetization directions of the first magnetic layer 41 and the second magnetic layer 42) is set to the magnetoresistance effect element 40 will be described. When writing "1" to the magnetoresistance effect element 40, current is allowed to flow towards the upper layer side from the lower layer side in FIG. 6. Therefore, electrons "e⁻" flow from the upper layer side towards the lower layer side in FIG. 6.

First, focusing only on the second magnetoresistance effect element portion 40b, electrons e⁻ flow towards the third magnetic layer 43 from the second magnetic layer 42. From the second magnetic layer 42, electrons e⁻ having an upward spin are easily injected to the third magnetic layer 43, electrons e⁻ having an upward spin are dominant in the third magnetic layer 43. Therefore, the magnetization direction of the third magnetic layer 43 becomes parallel to the magnetization direction of the second magnetic layer 42.

On the other hand, focusing only on the first magnetoresistance effect element portion 40a, electrons e⁻ flow towards the first magnetic layer 41 from the third magnetic layer 43. From the third magnetic layer 43, electrons e⁻ having an upward spin are easily injected to the first magnetic layer 41, and therefore electrons e⁻ having a downward spin remain in the third magnetic layer 43. Therefore, the magnetization direction of the third magnetic layer 43 becomes antiparallel to the magnetization direction of the first magnetic layer 41.

As described above, when writing "1" to the magnetoresistance effect element 40, the magnetization direction of the third magnetic layer 43 easily becomes anti-parallel to the magnetization direction of the first magnetic layer 41 in the first magnetoresistance effect element portion 40a, whereas the magnetization direction of the third magnetic layer 43 easily becomes parallel to the magnetization direction of the second magnetic layer 42 in the second magnetoresistance effect element portion 40b. Therefore, as in the case where "0" is written to the magnetoresistance effect element 40, if the write efficiency of the first magnetoresistance effect element portion 40a is higher than the write efficiency of the second magnetoresistance effect element portion 40b, the magnetization direction of the third magnetic layer 43 is set downward based on the magnetization direction in the first magnetoresistance effect element portion 40a. As a result, the magnetization direction of the third magnetic layer 43 becomes antiparallel to the magnetization directions of the first magnetic layer 41 and the second magnetic layer 42, and therefore "1" is written to the magnetoresistance effect element 40.

As described above, in both cases where "0" and "1" are written to the magnetoresistance effect element 40, the action to force the magnetization direction upward and the action to force it downward occur to the third magnetic layer 43. As a result, a difference between the both actions substantially work on the third magnetic layer 43. Therefore, for the magnetoresistance effect element 40 of this embodiment constituted by the two magnetoresistance effect element portions 40a and 40b, it is necessary to increase the write current as compared to general magnetoresistance effect elements constituted by only one magnetoresistance effect element, portion.

As described above, in the magnetoresistance effect element 40 of this embodiment, a write cannot be carried out unless the write current is increased, and thus it is possible to prevent erroneous writes when a read operation is to be carried out, which may occur if the read current is increased. Therefore, in this embodiment, a margin in the read operation can be increased, thereby making it possible to carry cut a stable read operation in which the read disturb is inhibited.

Further, in this embodiment, the MR ratio of the first magnetoresistance effect element portion 40a and the MR ratio of the second magnetoresistance effect, element portion 40b are different from each other. More specifically, the MR ratio cf the first magnetoresistance effect element portion 40a is higher than the MR ratio of the second magnetoresistance effect element, portion 40b.

Generally, in the magnetoresistance effect element, the write efficiency is higher in the case where "0" is written than in the case where "1" is written. Therefore, if the MR ratio of the first magnetoresistance effect element portion 40a and the MR ratio of the second magnetoresistance effect element portion 40b are the same as each other, "0" is always written to both of the first magnetoresistance effect element portion 40a and the second magnetoresistance effect element portion 40b. Thus, regardless of the flowing direction of the write current, "0" is always written to the magnetoresistance effect element 40.

In this embodiment, by raising the MR ratio of the first magnetoresistance effect element portion 40a higher than the MR ratio of the second magnetoresistance effect element portion 40b, the write efficiency (the electron injection efficiency through the first tunnel barrier layer 46) of the first magnetoresistance effect element portion 40a becomes higher than the write efficiency (the electron injection efficiency through the second tunnel barrier layer 47) of the second magnetoresistance effect element portion 40b. Thus, such a problem stated above can be avoided. More specifically, current is allowed to flow from the upper layer side towards the lower layer side in FIG. 6 (that is, electrons are "e⁻" are allowed to flow from the lower layer side towards the upper layer side in FIG. 6), and thus "0" can be written to the magnetoresistance effect element 40, whereas current is allowed to flow towards the upper layer side from the lower layer side in FIG. 6 (that is, electrons "e⁻" are allowed to flow from the upper layer side towards the lower layer side in FIG. 6) and thus "1" can be written to the magnetoresistance effect element 40.

Further, in this embodiment, the magnetoresistance effect element 40 is constituted substantially by the first the magnetoresistance effect element portion 40a and the second magnetoresistance effect element portion 40b connected in series, and therefore the read voltage becomes higher as compared to those of the general magnetoresistance effect elements. Thus, the difference between the read voltage when "0" (the low resistance state) is stored in the magnetoresistance effect element 40 and the read voltage when "1" (the high resistance state) is stored in the magnetoresistance effect element 40 can be increased.

In this manner, the data (0 or 1) stored in the magnetoresistance effect element 40 can be accurately read.

Further, even if the read voltage is high, divided voltages are respectively applied to the first magnetoresistance effect element portion 40a and the second magnetoresistance effect, element portion 40b. Therefore, the voltages respectively applied to the first tunnel barrier layer 46 and the second tunnel barrier layer 47 do not increase. Therefore, even if the read voltage is high, it is possible to inhibit high voltages from being applied to the first tunnel barrier layer 46 and the second tunnel barrier layer 47.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit, of: the inventions. The accompanying claims and their equivalents are intended to cover such forms or modifications as would fall within the scope and spirit, of the inventions.

What is claimed is:

1. A magnetic memory device comprising:
   a magnetoresistance effect element comprising:
   a first magnetic layer having a fixed magnetization direction;
   a second magnetic layer having a fixed magnetization direction;

a third magnetic layer provided between the first magnetic layer and the second magnetic layer, and having a variable magnetization direction;
a first nonmagnetic layer provided between the first magnetic layer and the third magnetic layer; and
a second nonmagnetic layer provided between the second magnetic layer and the third magnetic layer; and
a two-terminal switching element connected in series to the magnetoresistance effect element, being configured to change from an electrically nonconductive state to an electrically conductive state when a voltage applied between two terminals thereof is higher than or equal to a threshold voltage,
wherein:
the first nonmagnetic layer is an insulating layer,
the second nonmagnetic layer is an insulating layer, and
a magnetization direction of the first magnetic layer and a magnetization direction of the second magnetic layer are parallel to each other.

2. The magnetic memory device of claim 1, wherein the magnetoresistance effect element has a first resistance state in which a magnetization direction of the third magnetic layer is parallel to the magnetization direction of the first magnetic layer and the magnetization direction of the second magnetic layer and a second resistance state in which the magnetization direction of the third magnetic layer is antiparallel to the magnetization direction of the first magnetic layer and the magnetization direction of the second magnetic layer.

3. The magnetic memory device of claim 2, wherein the first resistance state and the second resistance state are set according to a direction of a current flowing through the magnetoresistance effect element.

4. The magnetic memory device of claim 2, wherein the second resistance state has a resistance higher than that of the first resistance state.

5. The magnetic memory device of claim 1, wherein:
the magnetoresistance effect element further comprises:
a fourth magnetic layer having a fixed magnetization direction; and
a fifth magnetic layer having a fixed magnetization direction,
a magnetization direction of the fourth magnetic layer and a magnetization direction of the fifth magnetic layer are antiparallel to the magnetization direction of the first magnetic layer and the magnetization direction of the second magnetic layer, and
the first, second and third magnetic layers are provided between the fourth magnetic layer and the fifth magnetic layer.

6. The magnetic memory device of claim 5, wherein the magnetoresistance effect element further comprises:
a first intermediate layer provided between the first magnetic layer and the fourth magnetic layer, and formed of a metal material; and
a second intermediate layer provided between the second magnetic layer and the fifth magnetic layer, and formed of a metal material.

7. The magnetic memory device of claim 1, wherein:
the first nonmagnetic layer corresponds to a first tunnel barrier layer, and
the second nonmagnetic layer corresponds to a second tunnel barrier layer.

8. The magnetic memory device of claim 1, wherein:
the first nonmagnetic layer contains magnesium (Mg) and oxygen (O), and the second nonmagnetic layer contains magnesium (Mg) and oxygen (O).

9. A magnetic memory device comprising:
a magnetoresistance effect element comprising:
a first magnetic layer having a fixed magnetization direction;
a second magnetic layer having a fixed magnetization direction;
a third magnetic layer provided between the first magnetic layer and the second magnetic layer, and having a variable magnetization direction;
a first nonmagnetic layer provided between the first magnetic layer and the third magnetic layer; and
a second nonmagnetic layer provided between the second magnetic layer and the third magnetic layer; and
a two-terminal switching element connected in series to the magnetoresistance effect element, being configured to change from an electrically nonconductive state to an electrically conductive state when a voltage applied between two terminals thereof is higher than or equal to a threshold voltage,
wherein:
the first nonmagnetic layer is an insulating layer,
the second nonmagnetic layer is an insulating layer,
the first nonmagnetic layer corresponds to a first tunnel barrier layer, and
the second nonmagnetic layer corresponds to a second tunnel barrier layer.

10. The magnetic memory device of claim 9, wherein:
the first magnetic layer, the third magnetic layer and the first nonmagnetic layer constitute a first magnetoresistance effect element portion, and
the second magnetic layer, the third magnetic layer and the second nonmagnetic layer constitute a second magnetoresistance effect element portion.

11. The magnetic memory device of claim 10, wherein an MR ratio of the first magnetoresistance effect element portion and an MR ratio of the second magnetoresistance effect element portion are different from each other.

12. The magnetic memory device of claim 9, wherein each of the first, second and third magnetic layers has a perpendicular magnetization.

13. The magnetic memory device of claim 9, wherein the magnetoresistance effect element is a spin transfer torque (STT) magnetoresistance effect element.

14. The magnetic memory device of claim 9, further comprising:
a first wiring line extending along a first direction; and
a second wiring line extending along a second direction intersecting the first direction,
wherein the magnetoresistance effect element and the switching element are connected in series between the first wiring line and the second wiring line.

15. A magnetic memory device comprising:
a magnetoresistance effect element comprising:
a first magnetic layer having a fixed magnetization direction;
a second magnetic layer having a fixed magnetization direction;
a third magnetic layer provided between the first magnetic layer and the second magnetic layer, and having a variable magnetization direction;
a first nonmagnetic layer provided between the first magnetic layer and the third magnetic layer; and
a second nonmagnetic layer provided between the second magnetic layer and the third magnetic layer; and a two-terminal switching element connected in series to the magnetoresistance effect element, being configured to change from an electrically nonconductive state to an electrically conductive state when a voltage applied between two terminals thereof is higher than or equal to a threshold voltage, wherein:

the first nonmagnetic layer is an insulating layer, the second nonmagnetic layer is an insulating layer, the first nonmagnetic layer contains magnesium (Mg) and oxygen (O), and the second nonmagnetic layer contains magnesium (Mg) and oxygen (O).

16. The magnetic memory device of claim 15, wherein:

the first magnetic layer, the third magnetic layer and the first nonmagnetic layer constitute a first magnetoresistance effect element portion, and the second magnetic layer, the third magnetic layer and the second nonmagnetic layer constitute a second magnetoresistance effect element portion.

17. The magnetic memory device of claim 16, wherein an MR ratio of the first magnetoresistance effect element portion and an MR ratio of the second magnetoresistance effect element portion are different from each other.

18. The magnetic memory device of claim 15, wherein each of the first, second and third magnetic layers has a perpendicular magnetization.

19. The magnetic memory device of claim 15, wherein the magnetoresistance effect element is a spin transfer torque (STT) magnetoresistance effect element.

20. The magnetic memory device of claim 15, further comprising:

a first wiring line extending along a first direction; and a second wiring line extending along a second direction intersecting the first direction, wherein the magnetoresistance effect element and the switching element are connected in series between the first wiring line and the second wiring line.

* * * * *